(12) United States Patent
Glass et al.

(10) Patent No.: US 8,022,854 B2
(45) Date of Patent: Sep. 20, 2011

(54) THERMOMETER CODE TRANSCODING AND ENCODING METHODS AND SYSTEMS

(75) Inventors: Kevin William Glass, Scottsdale, AZ (US); C. Gary Nilsson, Hawthorne, CA (US); Leo Ghazikhanian, Studio City, CA (US); Michael Terry Nilsson, Hermosa Beach, CA (US)

(73) Assignee: Semtech Corporation, Camarillo, CA (US)

( * ) Notice: Subject to any disclaimer, the term of this patent is extended or adjusted under 35 U.S.C. 154(b) by 26 days.

(21) Appl. No.: 12/551,452

(22) Filed: Aug. 31, 2009

(65) Prior Publication Data

US 2011/0050468 A1    Mar. 3, 2011

(51) Int. Cl.
   *H03M 1/12*    (2006.01)
(52) U.S. Cl. .................. 341/160; 341/159; 341/94
(58) Field of Classification Search .............. 341/94, 341/155, 156, 158, 159, 160
   See application file for complete search history.

(56) References Cited

U.S. PATENT DOCUMENTS

| | | | | |
|---|---|---|---|---|
| 5,155,489 | A * | 10/1992 | Gulczynski | 341/160 |
| 5,243,348 | A * | 9/1993 | Jackson | 341/160 |
| 6,079,009 | A | 6/2000 | Wise et al. | |
| 6,222,476 | B1 * | 4/2001 | Lee et al. | 341/159 |
| 6,263,422 | B1 | 7/2001 | Wise et al. | |
| 6,388,602 | B1 * | 5/2002 | Yang | 341/159 |
| 6,462,694 | B1 * | 10/2002 | Miyatake | 341/160 |
| 6,965,331 | B2 * | 11/2005 | Demartini et al. | 341/96 |
| 2004/0222906 | A1 | 11/2004 | DeMartini et al. | |
| 2005/0162878 | A1 | 7/2005 | Koide et al. | |

OTHER PUBLICATIONS

Cassel, et al., "Evaluating One-Hot Encoding Finite State Machines for SEU Reliability in SRAM-based FPGAs," Proceedings of the 12th IEEE International On-Line Testing Symposium (IOLTS'06), IEEE Computer Society, 2006, 6 pages, IEEE.

Chong, "A Technique for Improving the Accuracy and the Speed of CMOS Current-Cell DAC," IEEE Transactions on Circuits and Systems, Oct. 1990, pp. 1325-1327, vol. 37, No. 10, IEEE.

Chuang, et al., "A Novel Bubble Tolerant Thermometer-to-Binary Encoder for Flash A/D Converter," 2005, pp. 315-318, IEEE.

Huang, et al., "Design of High-Performance CMOS Priority Encoders and Incrementer/Decrementers Using Multilevel Lookahead and Multilevel Folding Techniques," IEEE Journal of Solid-State Circuits, Jan. 2002, pp. 63-76, vol. 37, No. 1, IEEE.

Huang, et al., "High-Performance and Power-Efficient CMOS Comparators," IEEE Journal of Solid-State Circuits, Feb. 2003, pp. 254-262, vol. 38, No. 2, IEEE.

Kanan, et al., "A 640mW High Accuracy 8-bit 1GHz Flash ADC Encoder," 1999, pp. II-420 through II-423, IEEE.

(Continued)

*Primary Examiner* — Howard Williams
(74) *Attorney, Agent, or Firm* — McDermott Will & Emery LLP

(57) ABSTRACT

Examples of systems and methods are provided for generating an output signal having an output code having less number of bits compared to an input signal having a thermometer code representation. The system may partition the input code bits into non-overlapping clusters. The system may generate a control signal for each of the clusters based on, at least in part, a logical OR operation over all bits in a corresponding one of the clusters. The system may determine a transition cluster comprising a 1/0 transition in the input code bits. The system may determine output code bits based on, at least in part, an input code bit pattern in the transition cluster and an identity of the transition cluster.

19 Claims, 9 Drawing Sheets

OTHER PUBLICATIONS

Kun, et al., "A Power-Optimized 64-Bit Priority Encoder Utilizing Parallel Priority Look-Ahead," ISCAS, 2004, pp. II-753 through II-756, IEEE.

Lee, et al., "Fat Tree Encoder Design for Ultra-High Speed Flash A/D Converters," 2002, pp. II-87 through II-90. IEEE.

Luong, et al., "Fully Parallel Superconducting Analog-To-Digital Converter," IEEE Transactions on Applied Superconductivity, Mar. 1993, pp. 2633-2636, vol. 3, No. 1, IEEE.

Mitra, et al., "Scan Synthesis for One-Hot Signals," International Test Conference, Paper 29.4, 1997, pp. 714-722, IEEE.

Säll, et al., "A Study of Digital Decoders in Flash Analog-To-Digital Converters," ISCAS, 2004, pp. I-129 through I-132, IEEE.

Tan, et al., "Low power multi-segment sequential one hot addressing architecture," IEE Proc.-Circuits Devices Syst., Apr. 2006, pp. 159-166, vol. 153, No. 2, IEE.

Wang, et al., "High-Speed and Low-Power CMOS Priority Encoders," IEEE Journal of Solid-State Circuits, Oct. 2000, pp. 1511-1514, vol. 35, No. 10, IEEE.

Yeh, et al., "A Novel Flash Analog-to-Digital Converter," 2008, pp. 2250-2253, IEEE.

Zrudsky, et al., "A Multichannel Minimum-Seeking Analog-to-Digital Converter," IEEE Transactions on Circuits and Systems, 1990, pp. 1314-1317, vol. 37, No. 10, IEEE.

* cited by examiner

THERMOMETER CODE TRANSCODING AND ENCODING METHODS AND SYSTEMS

CROSS-REFERENCES TO RELATED APPLICATIONS

The present application for patent is related to U.S. patent application Ser. No. 12/551,447, entitled "HIGH SPEED TRACK AND HOLD CIRCUIT," filed Aug. 31, 2009, assigned to the assignee hereof, and expressly incorporated by reference herein.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC. An SA ADC circuit generally produces a digital representation by processing an input analog signal through successive stages, each stage comprising a comparator configured to get a successively more accurate digital representation of the input analog signal. In a typical flash ADC circuit, an input analog signal value is compared with various reference levels, all at once, using multiple comparators. All other things being equal, because a flash ADC circuit has a single stage of comparators instead of multiple stages of comparators as in an SA ADC circuit, a flash ADC circuit may typically produce a digital representation of an analog input signal with lower latency than an SA ADC circuit. Therefore, the flash ADC technique is generally considered more suitable for a high speed application.

With the increasing demand for high data rates and constellation densities, especially in signals transmitted in the Giga Hertz (GHz) range, the demand for fast, accurate high speed ADC is ever increasing. When using a flash ADC circuit, this in turn may require certain aspects of the flash ADC circuit, such as suppressing errors in a digital representation of analog signals (sometimes called "bubble errors"), to be implemented using an accurate, high speed circuit.

In certain aspects of the disclosure, a better error filtering circuit is needed to meet the increased speed and accuracy requirements.

SUMMARY

In an aspect of the disclosure, an error suppression circuit apparatus may be provided for generating an output signal having an output code from an input signal having a thermometer code representation. The error suppression circuit apparatus may comprise one or more of the following: a clustering circuit block configured to accept input code bits of the thermometer code representation of the input signal and to partition the input code bits into non-overlapping clusters, wherein each of the clusters comprises a portion of the input code bits, a control signal generation circuit block configured to generate a control signal for each of the clusters based on, at least in part, a logical OR operation over all bits in a corresponding one of the clusters, a cluster selection circuit block configured to determine a transition cluster for the input code bits based on, at least in part, the control signals, the transition cluster comprising a 1/0 transition in the input code bits, the cluster selection circuit block configured to determine one or more bits of the output code based on, at least in part, an identity of the transition cluster, and an encoding circuit block configured to determine the remaining bits of the output code based on, at least in part, an input code bit pattern in the transition cluster, the remaining bits having lower significant bit positions in the output code than the one or more bits, wherein the number of bits in the output code is less than the number of bits in the input code bits, and the total number of bits in the clusters is the same as the number of bits in the input code bits.

In another aspect of the disclosure, an error suppression method may be provided for generating an output signal having an output code from an input signal having a thermometer code representation utilizing circuits. The method may comprise one or more of the following: partitioning, using a circuit, input code bits of the thermometer code representation of the input signal into non-overlapping clusters, wherein each of the clusters comprises a portion of the input code bits, identifying, using a circuit, a transition cluster for the input code bits based on, at least in part, a logical OR operation over all bits in a cluster, the transition cluster comprising a 1/0 transition in the input code bits, determining, using a circuit, one or more bits of the output code based on, at least in part, an identity of the transition cluster, determining, using a circuit, the remaining bits of the output code based on, at least in part, an input code bit pattern in the transition cluster, the remaining bits having lower significant bit positions in the output code than the one or more bits, wherein the number of bits in the output code is less than the number of bits in the input code bits, and the total number of bits in the clusters is the same as the number of bits in the input code bits.

In yet another aspect of the disclosure, an error suppression circuit apparatus may be provided for generating an output signal having an output code from an input signal having a thermometer code representation. The error suppression circuit apparatus may comprise one or more of the following: means for accepting input code bits of the thermometer code representation of the input signal and partitioning the input code bits into non-overlapping clusters, wherein each of the clusters comprises a portion of the input code bits, means for identifying a transition cluster for the input code bits based on, at least in part, a logical OR operation over all bits in a cluster, the transition cluster comprising a 1/0 transition in the input code bits, means for determining one or more bits of the output code based on, at least in part, an identity of the transition cluster, and means for determining the remaining bits of the output code based on, at least in part, an input code bit pattern in the transition cluster, the remaining bits having lower significant bit positions in the output code than the one or more bits, wherein the number of bits in the output code is less than the number of bits in the input code bits, and the total number of bits in the clusters is the same as the number of bits in the input code bits.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
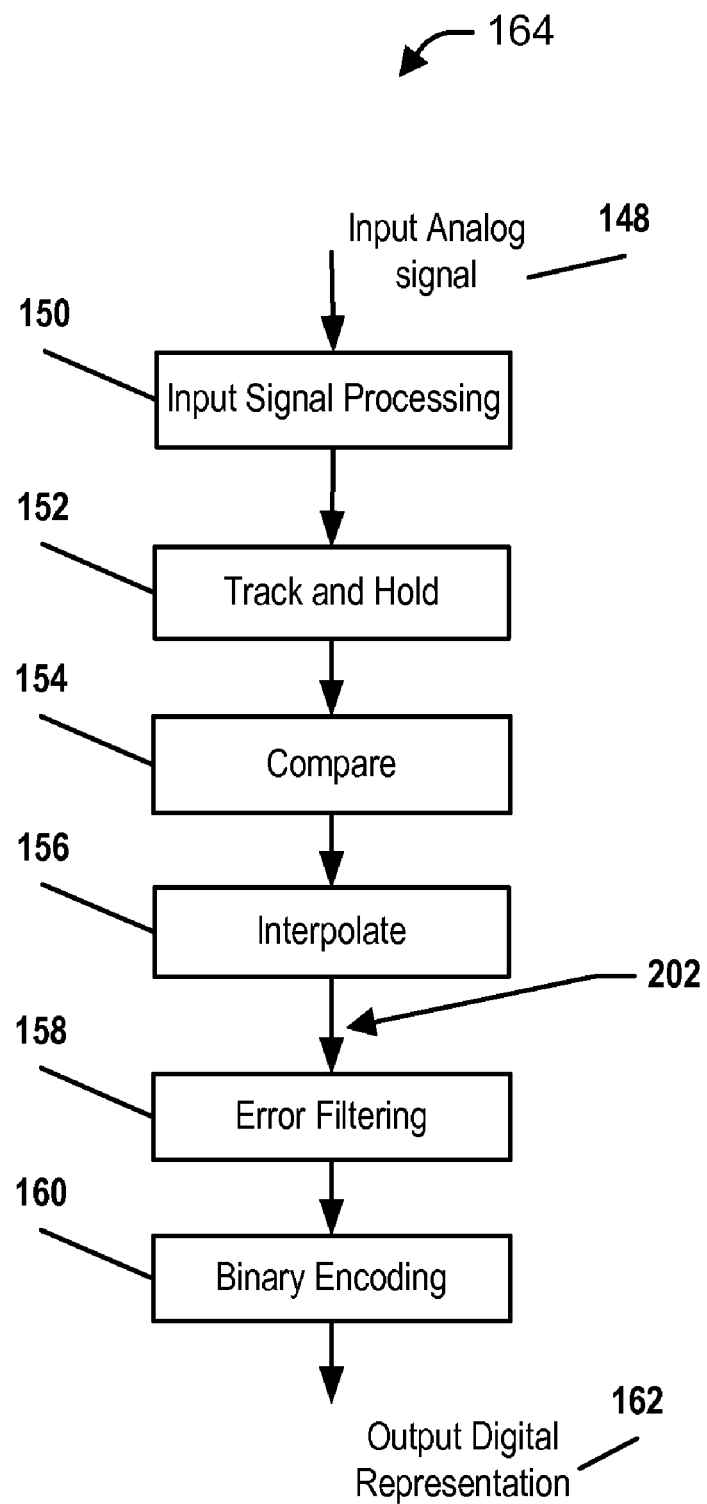
FIG. 1 is a functional block diagram of a flash analog-to-digital conversion circuit in accordance with certain configurations of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

Analog-to-digital conversion (ADC) processing is used in a variety of applications including digital communication systems and digital signal and image processing systems. One approach to ADC, particularly when high data rates are involved, may be referred to as a flash ADC. In a typical flash ADC system, an input analog signal is sampled and the amplitude of the sampled signal is compared with multiple digital reference signals, typically all at once, to generate a digital representation. An error filtering circuit is typically used to suppress errors in raw representation of digitized analog signals. For example, a digital representation may be sometimes called "thermometer code," and a digital representation is often used in an ADC system. A thermometer code representation may suffer from so called "bubble errors." The bubble errors may be suppressed by transforming the thermometer code using an error filtering circuit to an output code comprising less number of bits than the thermometer code.

In one aspect, the term "bipolar junction transistor (BJT)" may refer to any of a variety of multi-terminal transistors generally operating on the principal of carrying current using both electrons and holes, including but not limited to an n-p-n BJT, a p-n-p BJT, and a heterojunction BJT (HBT).

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter, and a collector of a bipolar junction transistor. In another aspect, a base, an emitter, and a collector may refer to a gate, a source, and a drain of a field effect transistor, respectively. In another aspect, the terms "gate," "source," and "drain" may refer to "base," "emitter," and "collector" of a transistor, respectively.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

FIG. 1 is a functional block diagram of a flash analog-to-digital conversion (ADC) circuit 164 in accordance with certain configurations of the present disclosure. A flash ADC circuit may be implemented to obtain, for example, a 6-bit digital representation of an OC-768 compliant analog signal comprising 38,486.016 Mbit/s data traffic in a communication receiver. The flash ADC circuit 164 converts an input analog signal 148 to an output digital representation 162. The input analog signal 148 is processed in an input signal processing block 150. The input signal processing block 150 may, for example, perform the task of matching impedance of the flash A/D circuit 164 to a previous block. The input signal processing block 150 may also generate multiple reference signals, using for example a resistive ladder. A track-and-hold (T/H) block 152 may sample the input analog signal 148 and hold the sampled value constant, as a sampled output signal, for a duration required for the subsequent processing.

Still referring to FIG. 1, a compare block 154 may compare the sampled output signal output by the T/H block 152 to a plurality of reference signals (e.g., produced by the input signal processing block 150 using a well known technique such as a resistive ladder) to produce an estimate of the signal level for the input analog signal 148. In general, for a flash ADC circuit 164 designed to achieve N bits of digital representation, $2^N-1$ comparisons may be performed simultaneously. The resolution of the estimate may be improved by using an interpolation block 156 to interpolate signal values between two signal levels of the previous block. The result 202 may be represented in a digital representation such as a thermometer code. The result 202 thus obtained may be filtered in an error filtering block 158 to remove errors of measurements. In certain configurations, such as bubble error suppression configurations, the error filtering block 158 and the binary encoding block 160 may be implemented simultaneously to produce the output digital representation 162.

In this disclosure, the operator "+" and the operator OR( ) are used to indicate a logical OR operation of the variables upon which the operators are acting. For example, expression a+b and expression OR(a,b) both indicate a logical OR output of two logical variables a and b. In this disclosure, the operator "." is used to indicate a logical AND operation of the variables upon which the operator is acting. In this disclosure, the notation $\overline{b}$ indicates the logical inverse (e.g., logical complement or negation) of a Boolean parameter b.

In one aspect, an ideal thermometer code may represent a signal value as a run of "1" bits proportional to the magnitude of the signal, preceded by or followed by "0" bits in the remaining position. In one aspect, the terms "precede" and "follow" are relative terms, and if an input or output code contains bits b0 through b3 (e.g., b3b2b1b0), then bit b1 may be viewed as preceded by bit b0, or bit b1 may be viewed as followed by bit b0. The length K of a thermometer code is often chosen to be an exponential of 2 (e.g., $K=2^M$, where M is a positive integer), lending itself to an M-bit representation of an output signal. For example, a 4-bit thermometer code (K=4) may take the values 0000, 0001, 0011, 0111 and 1111. In an example for an 8-bit thermometer code, ideally, a signal may be represented by one of the following thermometer code words (in the order of a low to high signal magnitude): 00000000, 00000001, 00000011, 00000111, 00001111, 00011111, 00111111, 01111111 and 11111111. In this example, 00000000 may be viewed as representing a signal having the lowest magnitude, and 11111111 may be viewed as representing a signal having the highest magnitude.

A bubble error may refer to the presence of (i) one or more erroneous 1s in a run of one or more 0s or (ii) the presence of one or more erroneous 0s in a run of one or more 1s. For example, an 8-bit thermometer code having a value 01011111 may be considered to have a bubble error due to the underlined "0" in the sixth position (counting from the rightmost bit, which is at the first position). Similarly, an 8-bit thermometer code having a value 00001001 may be considered to have a bubble error in the fourth bit, when compared to underlying code 00000001. Alternatively, 00001001 may be considered to have bubble errors in positions 2 and 3, compared to the underlying code 00001111. Configurations of the present disclosure do not depend on any assumptions about a type of bubble error, the length of a run of 1s or 0s, or the length of bubble errors.

In certain configurations, if a thermometer code has K-bits and represents a signal, then one bit of the thermometer code may represent the sign of the signal (negative or positive), and the remaining K−1 bits may represent the magnitude of the signal. In such configurations, a signal having the highest magnitude may be represented as a run of (K−1) 1s (e.g., 1111111 if K=8), whereas a signal having the lowest magnitude may be represented as a run of (K−1) 0s (e.g., 0000000 if K=8). For example, when the length of a thermometer code is $2^M$ (where M is a positive integer), then one of the bits may be used to indicate the sign of the signal, and the other $2^M-1$ bits may be used to indicate the magnitude of the signal. As an example, a 64-bit thermometer code may comprise (i) 63 bits to represent the magnitude of the signal and (ii) 1 bit to represent the sign of the signal.

In certain configurations, bubble error suppression may be performed by transcoding an input thermometer code (e.g., an input code 202 in FIG. 1) into an output code (e.g., an output code that represents a signal outputted from an error filtering block 158, or an output code 162 in FIG. 1). In one aspect, the number of bits of the output code is less than the number of bits of the corresponding input thermometer code. In one aspect, an input thermometer code may be viewed as representing a signal in one format, and an output code may be viewed as representing the same signal in another format. In one aspect, the output code may have fewer errors (e.g., bubble errors) than the input thermometer code.

In one example, the above listed 8-bit input thermometer code word may be represented by a 3-bit output code word in which each output code word represents binary representation of the input thermometer code word (other representations such as octal, hexadecimal, etc. may also be possible). For example, the above listed 8-bit thermometer code words may be represented by output code words 000, 001, 010, 011, 100, 101, 110, and 111, each output code word being a binary representation of number of 1s in the corresponding input thermometer code word.

If an output code generation circuit receives an input thermometer code word such as "01011111," which has a bubble error in the sixth bit position, the output code generation circuit may produce "110" as the output code that corresponds to an "ideal" thermometer code word "01111111" without the bubble error. In other words, by generating an output code corresponding to an ideal input code word 01111111 and by generating an output code word comprising less number of bits than the input code word, the output generation circuit has suppressed the bubble error in the sixth bit position of the input code word 01011111. In one aspect, certain configurations of the present disclosure may suppress bubble errors in an input thermometer code word by generating an output code word corresponding to an ideal thermometer code word. The output code word may thus have fewer errors (e.g., less bubble errors) than the input thermometer code word.

Accordingly, configurations of the present disclosure may perform bubble error suppression by generating an output code representation from an input code representation, wherein the output code representation has less number of bits than the input code representation. In one aspect, an input thermometer code may use $2^M$ bits to represent an input signal, and the corresponding output code may use M bits to represent the same input signal.

In one aspect, a bubble error suppressing encoder may be used in a 6-bit output ADC circuit. The encoder may provide two parts: a most significant bits (MSB) part (e.g., 3 MSBs) and a less significant bits (LSB) part (e.g., 3 LSBs) of the 6-bit output digital representation. The input to the encoder may comprise a 64-bit digital signal in a thermometer code format (including a 1-bit sign). The input thermometer code bits may be divided into eight clusters. Three MSBs may indicate which cluster includes a transition from logical "1" to logical "0" (or from logical "0" to logical "1") in the thermometer code (the "1/0 transition cluster"). Three LSBs may indicate the bit pattern of 0s and is within the 1/0 transition cluster. To determine the 1/0 transition cluster, a control signal may be generated for each cluster indicating whether a run of 1s is present in the cluster. To obtain the control signal for a cluster, the value of the lowest significant bit of the cluster and the value of the lowest significant bit of the next cluster may be used. For example, a control signal for a cluster (that comprises bits $CMP_8$ to $CMP_{15}$) may be equal to $CMP_8 \cdot \overline{CMP_{16}}$, where $CMP_8$ is bit 8 (i.e., the lowest significant bit of the cluster, $CMP_{16}$ is bit 16 (i.e., the lowest significant bit of the next cluster), the operator "." is a logical AND operation, and $\overline{CMP_{16}}$ is the logical inverse of $CMP_{16}$.

One drawback with this method is that because the method only uses the end bit of a cluster (e.g., the lowest significant bit), the 1/0 transition determination is prone to bubble errors that occur at cluster edges. Another drawback of the above method is that the relative errors in output representation due to missed detection and suppression of bubble errors have a greater impact on low magnitude signals compared to their impact on high magnitude signals. Furthermore, the above method utilizes a metal oxide semiconductor (MOS) implementation, which does not benefit from a common emitter implementation of OR function using bipolar junction transistor (BJT) technology, as discussed below.

In one aspect of the present disclosure, it may be more advantageous to utilize BJTs, particularly for low complexity and low latency bubble error applications.

Broadly and generally, in one aspect, the present disclosure provides bubble error suppression configurations that may divide input bits into a plurality of clusters, detect signal activity in each cluster and identify the 1/0 signal transition cluster. The MSBs of the output code may indicate the cluster having the 1/0 transition, and the LSBs of the output code may indicate bit patterns of 1s and 0s within the 1/0 transition cluster. The bubble error processing configurations may perform error filtering and/or binary encoding operations.

Broadly and generally, in one aspect, the present disclosure provides bubble error suppression configurations that may suppress "sparkle errors." "Sparkle errors" may refer to errors at the output of a circuit caused by differences in phases of input signals. A typical example of a sparkle error is a two-input exclusive OR (XOR) operation. The output of an XOR operation changes when at least one input changes in value. For example, when both inputs to a 2-input XOR circuit are at logical 0, the output may typically also be at logical 0. If both inputs change to logical 1, the output may typically still remain at logical 0. However, if the transition of one of the inputs from logical 0 to logical 1 occurs prior to transition of the other input, the output may change to logical 1 for a short time, producing a "sparkle" at the output, before changing back to logical 0. In one aspect, the configurations of the present disclosure may suppress sparkle errors by foregoing the use of exclusive-or (XOR) logic. In certain configurations, a combination of OR and AND logic circuits is used in place of an XOR logic.

6-Bit ADC Example

Figure 2:
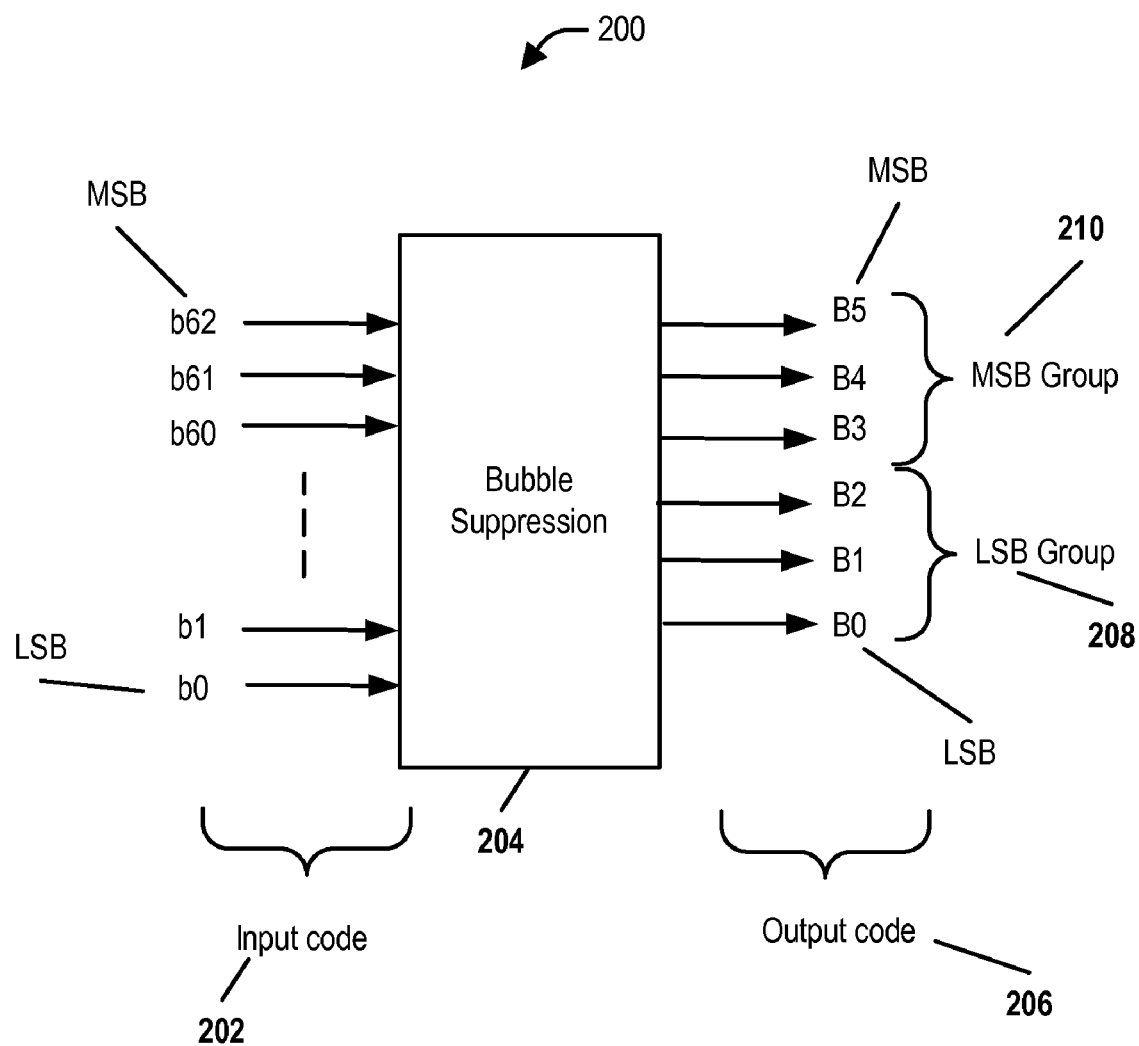
FIG. 2 is a block diagram of a system for performing error filtering and binary coding, in accordance with certain configurations of the present disclosure.

FIG. 2 is a block diagram of a bubble error suppression configuration 200, in accordance with certain configurations of the present disclosure. The illustrated configuration depicts a system that may be used in a 6-bit flash ADC system. In a 6-bit flash ADC, the compare and interpolate stages 154, 156 in FIG. 1 may produce 64-bit input code 202. One of the 64 bits may be used to indicate polarity (negative or positive) of the input analog signal 148, and the remaining 63 bits may indicate the magnitude of the input analog signal 148. The remaining 63 bits, b0 to b62, may represent a digital representation of the input analog signal 148.

In a thermometer code representation, each bit b0 to b62 may be a binary variable indicating whether the input analog signal 148 is lower or higher in magnitude than a corresponding reference voltage level. In the illustrated configuration, bit b0 is the least significant bit (LSB) and bit b62 is the most significant bit (MSB). In certain configurations, a signal having the largest magnitude (either positive or negative) may be represented by a 63-bit code word consisting of all 1s. Similarly, a signal with the lowest magnitude may be represented by b0=1 and all other bits equal to 0.

The bubble error suppression block 204 may be configured to generate a 6-bit output code 206 from the input code 202. The output code 206 may be represented by six bits: B0 (LSB) to B5 (MSB). The output code 206 is depicted as comprising two groups: an LSB group 208 comprising the three LSBs B0, B1, B2 and an MSB group 210 comprising the three MSBs B3, B4, and B5.

Figure 3:
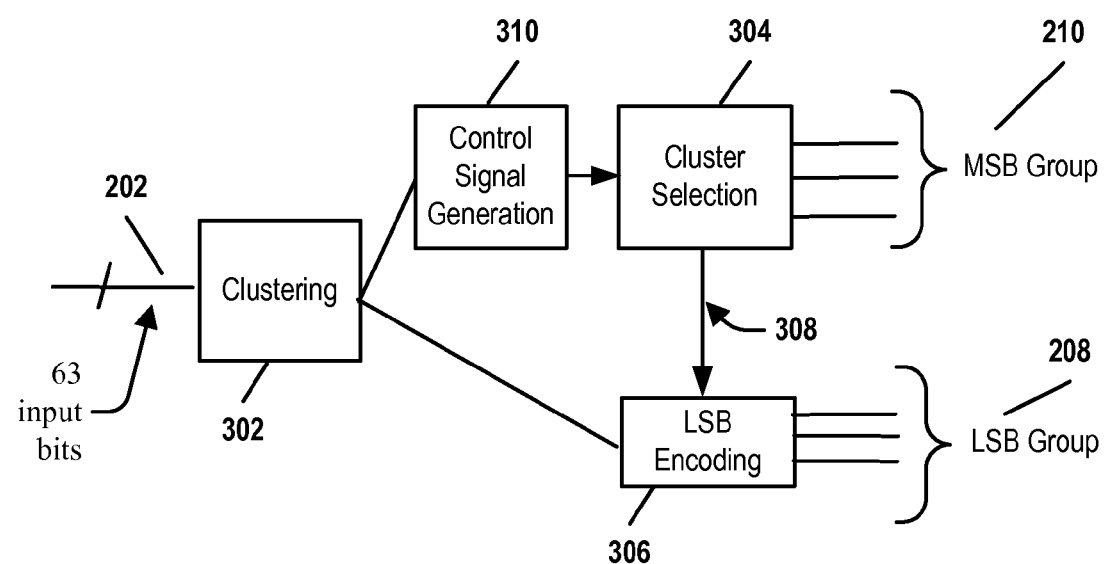
FIG. 3 is a block diagram of a system for generating an output code from an input code, in accordance with certain configurations of the present disclosure.

FIG. 3 is a functional block diagram of the bubble error suppression block 204, in accordance with certain configurations of the present disclosure. A clustering block 302 may be provided for dividing the 63 input bits 202 into eight clusters, each cluster comprising 8 bits (except for the LSB cluster, which has 7 bits). Table 1 shows one possible organization of bits of the input code 202 into clusters, as may be performed in the clustering block 302.

TABLE 1

| Cluster Number | Input Bits |
|---|---|
| Cluster 1 | b0 to b6 |
| Cluster 2 | b7 to b14 |
| Cluster 3 | b15 to b22 |
| Cluster 4 | b23 to b30 |
| Cluster 5 | b31 to b38 |
| Cluster 6 | b39 to b46 |
| Cluster 7 | b47 to b54 |
| Cluster 8 | b55 to b62 |

When there are no bubble errors in the input code 202, the three MSBs 210 in the output code 206 may represent the cluster in which there is a transition in the thermometer code from bit value(s) "1" to "0" or "0" to "1" (a transition cluster). Therefore, the three MSBs 210 of the output may be obtained by determining the cluster in which the 1/0 transition occurs.

A control signal generation block 310 may be provided to detect the presence of a "1" value (also sometimes called the presence of a signal activity) in bits of a cluster. The control signal generation block 310 may generate a control signal for each cluster, the control signal indicating the presence of a signal activity (e.g., presence of a "1" bit) in that cluster. In the illustrated configuration, eight control signals M1 to M8 for the corresponding clusters 1 to 8 are generated as shown in Table 2. The OR( ) operation in the right hand column in Table 2 indicates a logical OR operation on all variables inside the parentheses. Therefore, in this example, a control signal for a cluster may be "1" if at least one of the bits in the cluster is "1."

TABLE 2

| Cluster Number | Control Signal | Input Bits |
|---|---|---|
| Cluster 1 | M1 | OR (b0, b2, b3, b4, b5, b6) |
| Cluster 2 | M2 | OR (b7, b8, b9, b10, b11, b12, b13, b14) |
| Cluster 3 | M3 | OR (b15, b16, b17, b18, b19, b20, b21, b22) |
| Cluster 4 | M4 | OR (b23, b24, b25, b26, b27, b28, b29, b30) |
| Cluster 5 | M5 | OR (b31, b32, b33, b34, b35, b36, b37, b38) |
| Cluster 6 | M6 | OR (b39, b40, b41, b42, b43, b44, b45, b46) |
| Cluster 7 | M7 | OR (b47, b48, b49, b50, b51, b52, b53, b54) |
| Cluster 8 | M8 | OR (b55, b56, b57, b58, b59, b60, b61, b62) |

In one example, the control signal generation block 310 may include a plurality of control signal determining blocks. Each of the control signal determining blocks may be associated with its corresponding cluster and may be configured to determine a control signal for its corresponding cluster. The number of control signal determining blocks may be, in one example, at least the same as the number of clusters. In one instance, each of the control signal determining blocks may include a circuit for performing an OR operation.

Still referring to FIG. 3, a cluster selection block 304 may be provided to generate, based on the control signals generated by the control signal generation block 310, the values of the MSB bits 210. The values of the MSB bits 210 may correspond to a transition cluster. The transition cluster may represent the cluster in which the run of one or more 1s ends and is preceded by (or followed by) one or more 0s in the remaining higher significant bit positions. In one aspect, there may be only one transition cluster for a given input code, and the MSB bits 210 may be chosen to indicate the transition cluster.

In certain configurations, when the control signals of multiple clusters are "1," the cluster containing higher significant bit(s) of the input code may be selected as the transition cluster. The cluster selection block 304 may then generate the output MSB bits based on the selected transition cluster. For example, with reference to Table 2, if both control signals M5 and M6 are "1," then M6 may be used to generate output MSB bits 210.

In one aspect, referring to Table 2, a cluster containing input code bit(s) with higher bit number(s) may be considered to be a cluster having higher significant bit(s) of the input code. For example, bit b5 has a higher bit number than bit b3, and thus, for the selection of a transition cluster, if the control signal of Cluster 8 (i.e., the control signal for the cluster containing bit b5) is "1", and the control signal of Cluster 1 (i.e., the control signal for the cluster containing bit b3) is also "1," then Cluster 8 (i.e., the cluster containing bit b56) may be selected, as a transition cluster, over Cluster 1 (i.e., the cluster containing bit b3). Furthermore, in one aspect, Cluster 8 may be considered to have higher significant bits of the input code than Cluster 7, 6, 5, 4, 3, 2 or 1; Cluster 7 may be considered to have higher significant bits of the input code than Cluster 6, 5, 4, 3, 2 or 1; Cluster 6 may be considered to have higher significant bits of the input code than Cluster 5, 4, 3, 2 or 1; Cluster 5 may be considered to have higher significant bits of the input code than Cluster 4, 3, 2 or 1; Cluster 4 may be considered to have higher significant bits of the input code than Cluster 3, 2 or 1; Cluster 3 may be considered to have higher significant bits of the input code than Cluster 2 or 1; and Cluster 2 may be considered to have higher significant bits of the input code than Cluster 1. The subject technology is not limited to the above method of selection, and other methods may be employed.

In one example, if an input code contains bits b0 through b127 (e.g., b127, . . . , b0), bit b0 may be considered to be a lower significant bit of the input code compared to bit b127. In another example, bit b0 may be considered to be a higher significant bit of the input code compared to bit b127. The subject technology is not limited to the examples described herein. For example, the subject technology is not limited to any specific number of bits or any specific "naming" method of significant bits, higher significant bits or lower significant bits. In one aspect, the phrases "significant bits," "higher significant bits," "lower significant bits," "lease significant bits," "most significant bits" are relative phrases and may be interchanged in certain configurations. For instance, while one configuration utilizes "higher significant bits" or uses the phrase "higher significant bits," another configuration may utilize "lower significant bits" or uses the phrase "lower significant bits." In one aspect, the term "bit" or "bits" may refer to one or more bits.

Table 3 shows an example of a possible mapping between MSB bits and control signals.

TABLE 3

| Output MSB Bit | Mapping |
| --- | --- |
| B5 | $\overline{M5}$ |
| B4 | $M3.\overline{M5} + M7$ |
| B3 | $M2.\overline{M3} + M4.\overline{M5} + M6.\overline{M7} + M8$ |

A least significant bits (LSBs) encoding block 306 may be used to compute LSBs 208 using the bits of the input code in the transition cluster. The three LSBs 208 may represent a bit pattern within the transition cluster. For example, if bits L0 through L7 represent least significant to the most significant bits in the transition cluster, then the three LSBs 208 may be calculated using a mapping as shown in Table 4.

TABLE 4

| LSB bit | Mapping |
| --- | --- |
| B2 | $L7 + L6 + L5 + L4$ |
| B1 | $L2.\overline{L4} + L6$ |
| B0 | $L1.\overline{L2} + L3.\overline{L4} + L5.\overline{L6} + L7$ |

In certain configurations, the generation of MSB bits 210 and LSB bits 208 may be performed substantially simultaneously in parallel to each other. When performing the generations in parallel, the LSB encoding block 306 may calculate a set of possible LSB bits 208 for each cluster. Using a cluster selection signal 308 generated by the cluster selection block 206 indicating the transition cluster, the LSB encoding block 306 may then output the LSB bits generated based on the bit pattern in the transition cluster as the LSB bits 208. In certain configurations, the generation of MSB bits 210 and LSB bits 208 may be performed sequentially. For example, in certain configurations, MSB bits 210 may first be generated, and the LSB bits 208 may be generated based on the identity of the transition cluster, as indicated by the MSB bits 210.

In FIG. 3, each of the blocks may be circuit blocks. For example, each of the blocks 302, 304, 306, and 310 may include transistors such as bipolar junction transistors (BJTs), field effect transistors (FETs), and/or bipolar complementary metal oxide semiconductor (BiCMOS) transistors specifically configured to perform the various functions described herein.

Figure 4:
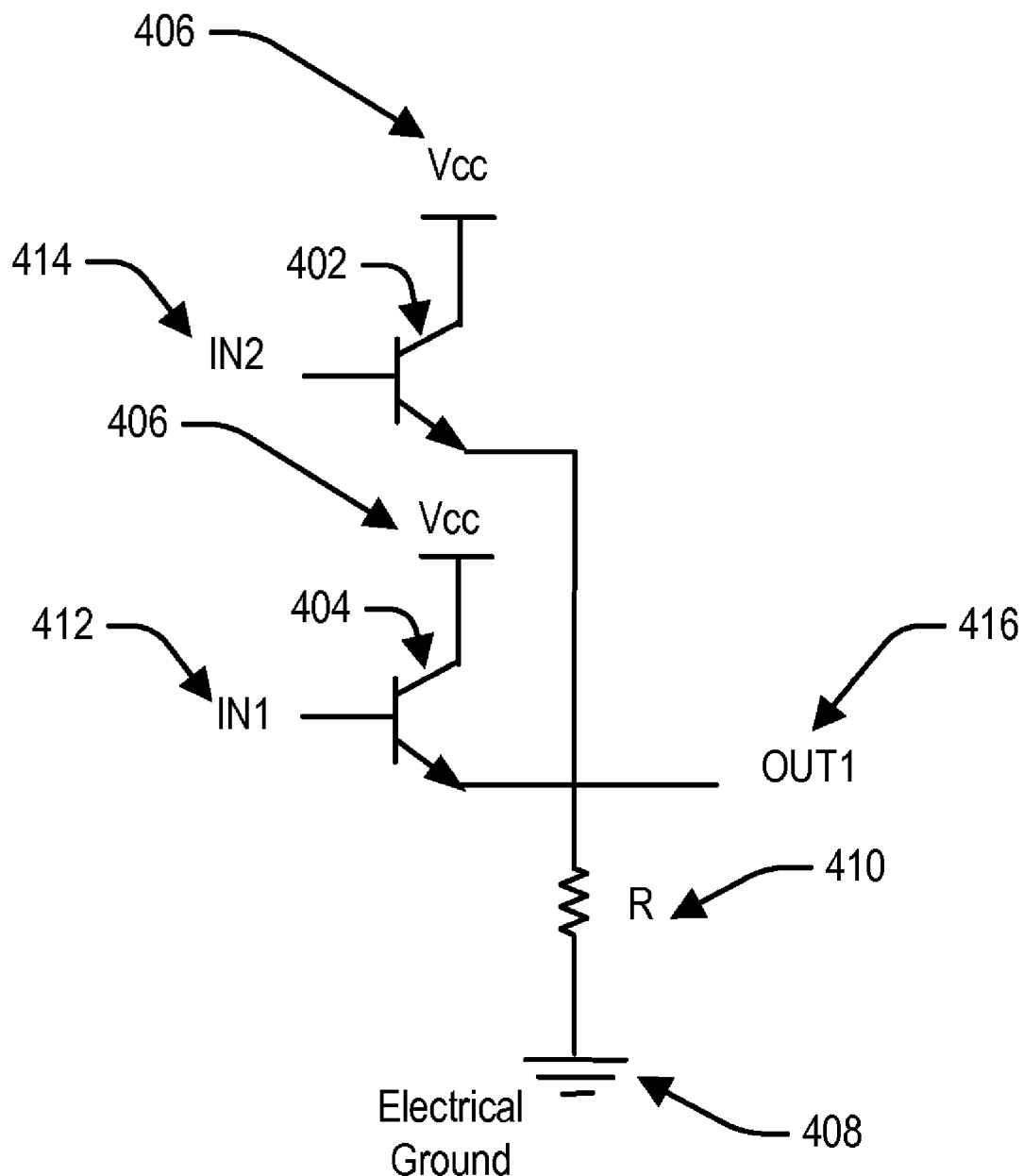
FIG. 4 is a circuit diagram of a common emitter logical OR operation circuit, in accordance with certain configurations of the present disclosure.

FIG. 4 is a circuit diagram of a common emitter logical OR operation circuit, in accordance with certain configurations of the present disclosure. A common emitter logical OR operation circuit may be used, for example, to perform the operations shown in Table 2. The illustrated circuit depicts calculation of logical OR of two signals: IN1 412 and IN2 414 using two transistors 402 and 404, configured in a common emitter configuration. The emitters of transistors 402 and 404 may be tied together and further coupled to a resistor R 410, and further coupled to an electrical ground 408. The input signals In1 412 and In2 414 may be coupled to the bases of transistors 402 and 404 respectively. Transistors 402 and 404 may be coupled to a voltage source Vcc 406.

Still referring to FIG. 4, when both inputs IN1 412 and IN2 414 are at a logical low, biasing voltage on the bases of transistors 402 and 404 may be low, thereby turning off the transistors 402 and 404. When the transistors 402 and 404 are turned off, no current (except for a very small amount of gate leakage current) may travel through the resistor R 410, resulting in low output voltage at OUT1 416. If one or both of the inputs IN1 412 and IN2 414 are at a logical high, at least one of transistors 402 and 404 may be turned on, resulting in passage of current through resistor R 410, thereby pulling OUT1 to a logical high. One skilled in the art can appreciate that a logical OR of multiple variables, such as in Table 2, may be implemented by connecting emitters of multiple transistors similar to the two-transistor configuration of FIG. 4. One skilled in the art can also appreciate that the above-illustrated circuit computes a logical OR with a single gate delay and because as little as one transistor is needed for each input, the circuit can be implemented in a relatively small area.

Referring to FIG. 4 and Table 2, an OR operation circuit for cluster 1 may include six transistors (instead of two transistors 402 and 404 shown in FIG. 4) for receiving six inputs b0, b2, b3, b4, b5, and b6 (instead of two inputs IN2 and IN1 shown in FIG. 4), and the emitters of these six transistors may be commonly coupled to one another at an output (e.g., OUT1 as shown in FIG. 4) and coupled to a resistor (e.g., R 410).

Generalizing the 6-bit ADC example above, in general an input thermometer code may have K bits. It will be appreciated that in general, when the number of input thermometer code bits is a power-of-2 (i.e., $K=2^M$, where M is a positive integer), the output may be represented by an output having M bits (i.e., an M-bit output code). In certain configurations, one of the K bits may indicate the sign of the input signal. A clustering block may divide the remaining K−1 input bits into L clusters, each cluster having $N_i$ input code bits (where $1 \leq i \leq L$) such that the sum of the values of $N_1$ through $N_L$ is equal to K−1 (each variable K, $N_i$, i and L being a positive integer).

A control signal generation block may identify the presence of a signal activity (e.g., presence of a logical "1" bit) in each cluster i (where $1 \leq i \leq L$) by performing a logical OR operation over all of the bits in the cluster i, and may produce a control signal for each cluster i. Since there are L clusters, the control signal generation block may produce L control signals (one control signal for each cluster). A cluster selection block may use the L control signals to generate one or more bits of an output code (e.g., MSBs of the output code). These bits of the output code may represent a transition cluster (e.g., a cluster having a 1/0 transition). In one aspect, a 1/0 transition may be a transition from "1" to "0." In another aspect, a 1/0 transition may be a transition from "0" to "1." The remaining one or more bits of the output code (e.g., LSBs of the output code) may be generated using an LSB encoding block and a cluster selection signal indicating the transition cluster, generated by the cluster selection block. These remaining bits may indicate a pattern in the transition cluster.

In one example, K may represent the number of bits in an input thermometer code, L may represent the number of clusters or the number of control signals, and $N_i$ may represent the number of input code bits in the $i^{th}$ cluster. In one configuration, the value of $N_1$ may be N−1, the value of $N_i$ of an $i^{th}$ cluster (where $2 \leq i \leq L$) may be N, and the length of an input thermometer code may then be expressed as K=L*N, where N is a positive integer.

In the configurations illustrated in FIGS. 2-4, the 6-bit output code is calculated by partitioning bits into three MSBs and three LSBs. In certain configurations, bits may be partitioned such that 2 or 4 bits may be included in the MSB group 210 and 4 or 2 bits may be included in the LSB group 208 respectively. In general, when calculating an M-bit output code, $M_L$ MSBs may be determined based on the evaluation of control signals and a cluster with the 1/0 transition, and (M−$M_L$) LSBs may be determined using the LSB encoding logic 306 as described with reference to FIG. 3. In the example discussed in this paragraph, M indicates the number of bits in the output code, $M_L$ indicates the number of bits in MSBs, (M−$M_L$) indicates the number of bits in LSBs, $M_L$ and (M−$M_L$) are not equal, and $M_L$ and (M−$M_L$) are integers.

In one aspect, the choice of cluster sizes and the values of $M_L$ and M may allow an implementer to trade-off complexity in implementation. In one configuration, the size of the clusters may be chosen to be small (e.g., each cluster contains only a small number of bits). This may result in having a large number of clusters, and accordingly, a large number of control signals and a large number of bits in MSBs of the output code (e.g., a large $M_L$). In certain configurations, when the number of clusters is large, the circuits in the control signal generation block 310 and in the LSB encoding block 306 may become complex or may require a significant number of transistors.

In another configuration, if the size of the clusters is chosen to be large (e.g., each cluster contains a large number of bits), then this may result in having a small number of clusters, a small number of control signals, and a small number of bits in MSBs of the output code (e.g., a small $M_L$). In some configurations, when the number of clusters is small, the circuits in the control signal generation block 310 and in the LSB encoding block 306 may become less complex or may require less number of transistors.

An implementer may be able to make a selection of an optimal value for $M_L$, given the number of output bits M, by evaluating the complexity of implementation (e.g., the number of transistors, circuit design complexity) for various possible values of $M_L$ and selecting the value of $M_L$ that minimizes complexity of implementation.

Figure 5:
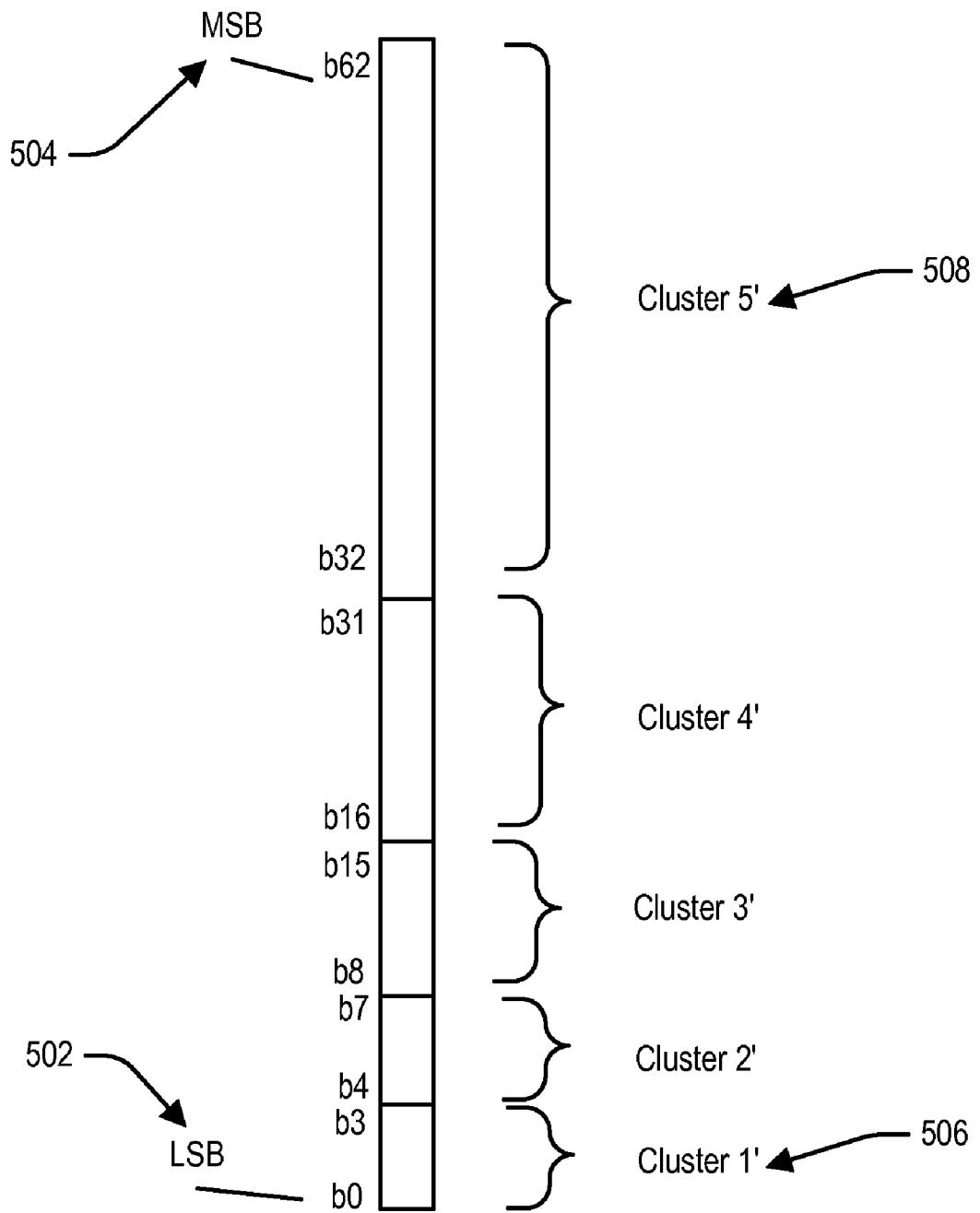
FIG. 5 is a block diagram illustrating clustering of an input code in clusters of different sizes, in accordance with certain configurations of the present disclosure.

FIG. 5 is a block diagram illustrating clustering of an input code in clusters of different sizes, in accordance with certain configurations of the present disclosure. In one aspect, variable-sized clustering may reduce the likelihood of identifying an incorrect cluster as a transition cluster for the MSBs of an output code.

The illustrated configuration shows a 63-bit input, comprising bits from the LSB b0 502 to the MSB b62 504, organized in five clusters having different sizes (e.g., different number of bits in each cluster). The five clusters include Cluster 1' 506 through Cluster 5' 508. This is shown in FIG. 5 and also in Table 5 below. One skilled in the art will appreciate that the illustrated organization is merely exemplary and many other organizations of clusters are possible.

TABLE 5

| Cluster Number | Input Bits |
| --- | --- |
| Cluster 1' | b0 to b3 |
| Cluster 2' | b4 to b7 |
| Cluster 3' | b8 to b15 |
| Cluster 4' | b16 to b31 |
| Cluster 5' | b32 to b62 |

In this example, clusters containing lower significant bits of the input thermometer code (e.g., Cluster 1' or Cluster 2') are smaller in size (e.g., have less number of bits) compared to the clusters containing higher significant bits of the input thermometer code (e.g., Cluster 4' or Cluster 5').

In one aspect, if an input signal (e.g., signal 148 in FIG. 1) has low magnitude, then the transition cluster is expected to be found in a cluster containing lower significant bits of the input thermometer code. In addition, a bubbler error may occur in bit positions close to the 1/0 transition. In this example (where an input signal has low magnitude), having smaller-sized clusters for lower significant bits of the input thermometer code may reduce the likelihood of misidentifying an incorrect cluster as the transition cluster, thus reducing the error in the output code.

In certain configurations, for a cluster p representing lower significant bits of an input thermometer code than a cluster q (p and q being positive integers), the number of input code bits $N_p$ in the cluster p ($N_p$ being the number of bits in the cluster p) may be chosen to be less than the number of input code bits $N_q$ in the cluster q ($N_q$ being the number of bits in the cluster q). Such a selection of cluster size may reduce the likelihood of misidentifying an incorrect cluster as the transition cluster for a low magnitude input signal. In another example, $N_p$ may be chosen to be the same as $N_q$.

Figure 6A:
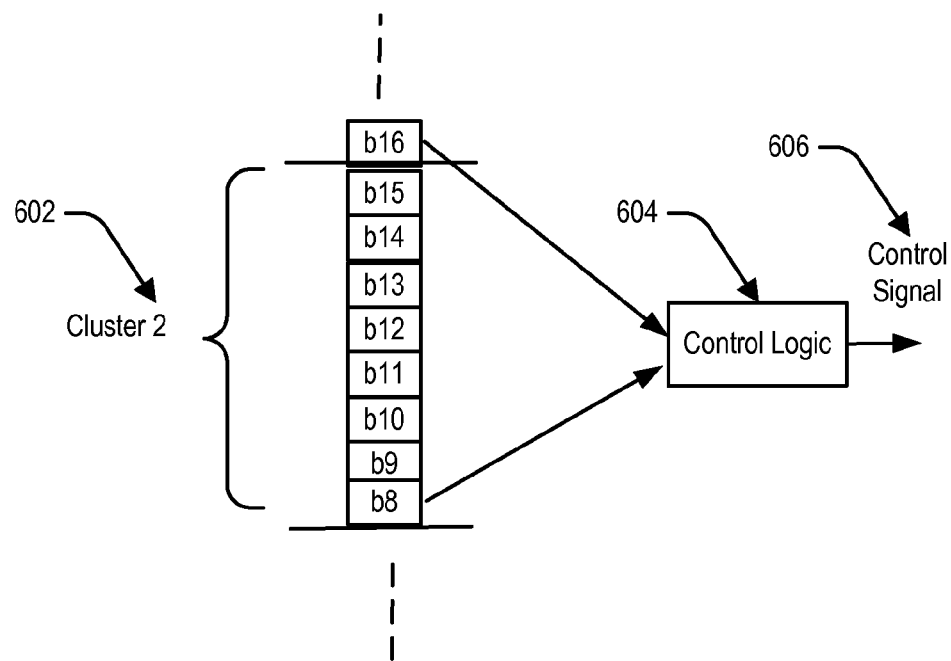
FIG. 6A is a block diagram illustrating generation of a control signal, in accordance with certain configurations of the present disclosure.

FIG. 6A illustrates a method of generating a control signal 606, in accordance with certain configurations of the present disclosure. A cluster 602 comprises 8 bits, labeled from b8 to b15, of an input code (not shown in the figure). The control logic block 604 is configured to generate the control signal 606 using b8 and b16 as inputs. For example, the control logic 604 may calculate $b_8 \cdot \overline{b_{16}}$ to generate the control signal 606. As previously discussed, one control signal may be generated for each cluster to indicate if the cluster has a signal activity or not. In one example, if an input thermometer code comprises bits 000001110 in the bit positions b16, ..., b8, the resulting control signal 606 may indicate that cluster 2 602 does not contain a 1/0 transition, or cluster 2 602 is not a transition cluster. In determining the control signal and the transition cluster, the method described with respect to FIG. 6A takes into account b8 and b16, but not b15, b14, b13, b12, b11, b10 or b9. If cluster 2 602 contains bubble errors at any of bit positions b15, b14, b13, b12, b11, b10 or b9, the method described with respect to FIG. 6A does not detect and does not correct these errors.

Figure 6B:
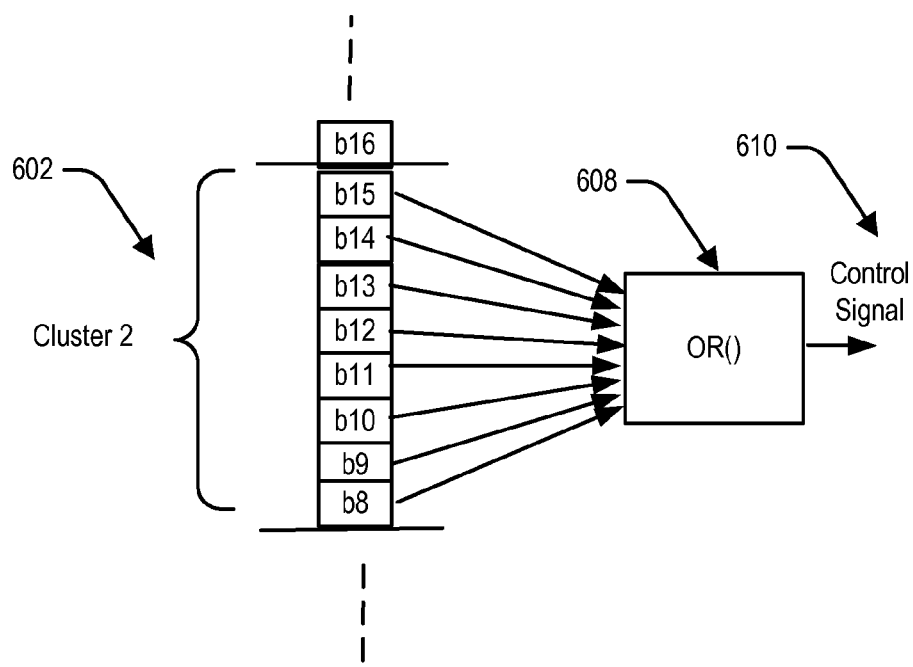
FIG. 6B is a block diagram illustrating generation of a control signal, in accordance with certain configurations of the present disclosure

FIG. 6B illustrates an alternate method for generation of control signal 610, in accordance with certain configurations of the present disclosure. The control signal generation logic 608 may use all bits b8 through b1 of the cluster 2 602 to generate a control signal 610. The control signal generation logic 608 may perform a logical OR of all bits in a cluster, as described with respect to Table 3 above, to calculate the control signal 610. Using the same example as discussed above with respect to FIG. 6A, if the input thermometer code comprises bits 000001110 in the bit positions b16, ... b8, then the resulting control signal 610 may indicate that cluster 2 602 includes a signal activity. The control signal 610 may be, for example, "1" to indicate that a signal activity is present in cluster 2 602. Unlike the method described in FIG. 6A, the control signal 610 of FIG. 6B indicates that cluster 2 602 may contain a 1/0 transition (because of the presence of a signal activity), and the control signal 610 may affect the determination of the identity of the transition cluster. In other words, the "0" at b8 may be considered to be a bubble error and be corrected by this method. Practitioners of the art will appreciate that for the illustrative example discussed above, the method described with respect to FIG. 6B may produce smaller error in generation of output code words than the method described with respect to FIG. 6A. Furthermore, the use of OR logic may result in an implementation that is layout efficient and low in delay.

Practitioners of the art will appreciate that the above-disclosed configurations of bubbler error suppression blocks and expressions in Tables 1-4 may be implemented without using XOR logic. In certain configurations, the expressions in tables 1-4 may be implemented using OR and AND logic.

In certain configurations, the clustering block 302 may divide input bits into non-power-of-2 number of clusters. In other words, if the clustering block 302 divides input bits into L clusters, then L may not be equal to 2, 4, 8, 16, etc. Such configurations may collectively called "non-binary clustering" configurations. In certain non-binary clustering configurations, due to the possibility of a carry-over, calculations of MSB group 210 may require information from calculations of LSB group 208. A non-binary clustering configuration may offer operational advantages of optimizing circuit complexity for a known input signal dynamic range and for a cluster selection and/or LSB encoding circuit.

Figure 7:
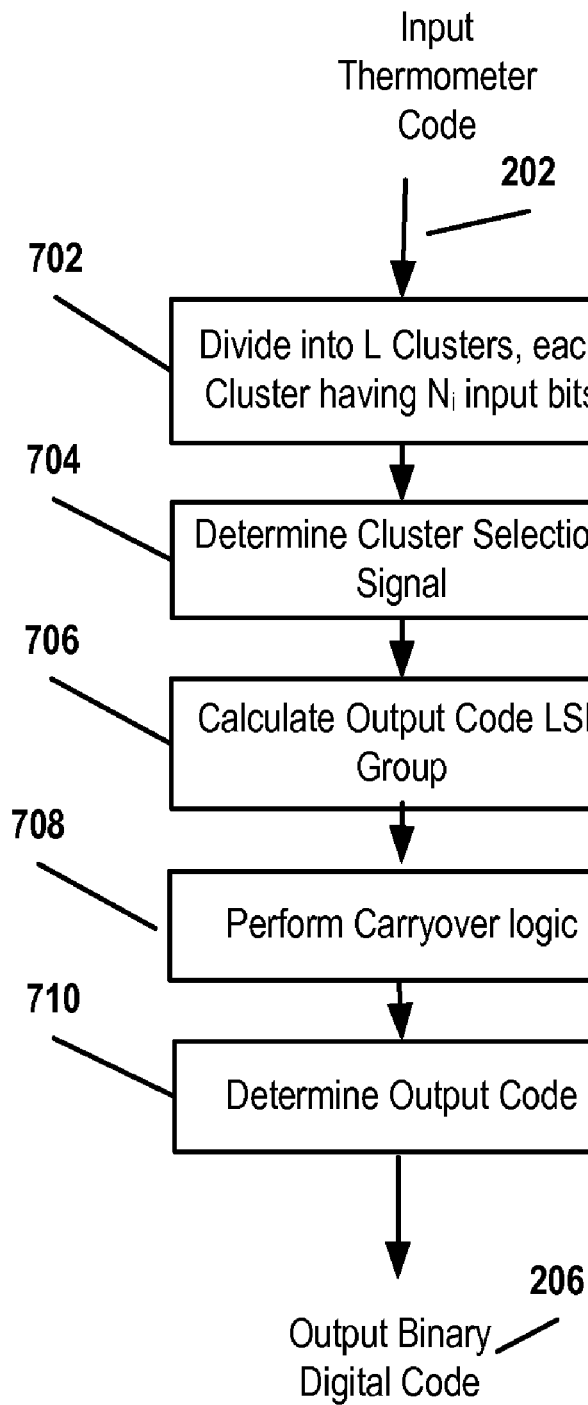
FIG. 7 is flow chart illustrating operations performed in generation of an output code, in accordance with certain configurations of the present disclosure.

FIG. 7 is flow chart illustrating operations performed in generation of an output code for a non-binary clustering configuration, in accordance with certain configurations of the present disclosure. At operation 702, input bits of a thermometer code 202 may be divided into L clusters, where cluster i has a size $N_i$ (i=1, ... L). At operation 704, the cluster including the 1/0 transition in the input thermometer code is selected. Operation 704 may be performed, for example, as discussed previously with respect to blocks 310 and 304 in FIG. 3. At operation 706, bits of the LSB group 208 of the output code word 206 may be determined, for example, generally consistent with the description with respect to block 306 in FIG. 3. At operation 708, carryover logic computation may be performed. The carryover logic may be used to adjust the value of the least significant bit of the MSB group 210. At operation 710, the output code word 206 may be generated by merging MSBs and LSBs, the MSBs being determined based on the result of the carryover calculation of operation 708 and the cluster selection signals determined at operation 704.

In the example illustrated with respect to FIG. 3, one level of clustering is shown. For example, an input code is divided into eight clusters, each having 8 bits. This may result in three most significant bits (e.g., 3 MSBs B5, B4 and B3) and three least significant bits (e.g., 3 LSBs B2, B1 and B0) of the output code, as described above.

In another configuration, multiple levels of clustering may be used. For example, an input code may be divided into a first set of four clusters, each having four bits and a second set of four clusters, each having four bits. The first set of clusters may provide values for the two most significant bits of the output code (e.g., 2 MSBs B5 and B4), and the second set of clusters may provide values for the next two most significant bits of the output code (e.g., 2 intermediate bits, B3 and B2). This example may also produce two least significant bits (e.g., 2 LSBs B1 and B0). Such a multi-level clustering configuration may be used to reduce design time by re-using a "building block" circuit (e.g., a 2-input circuit) multiple times. In addition, such multi-level implementations may reduce complexity of implementation.

Figure 8:
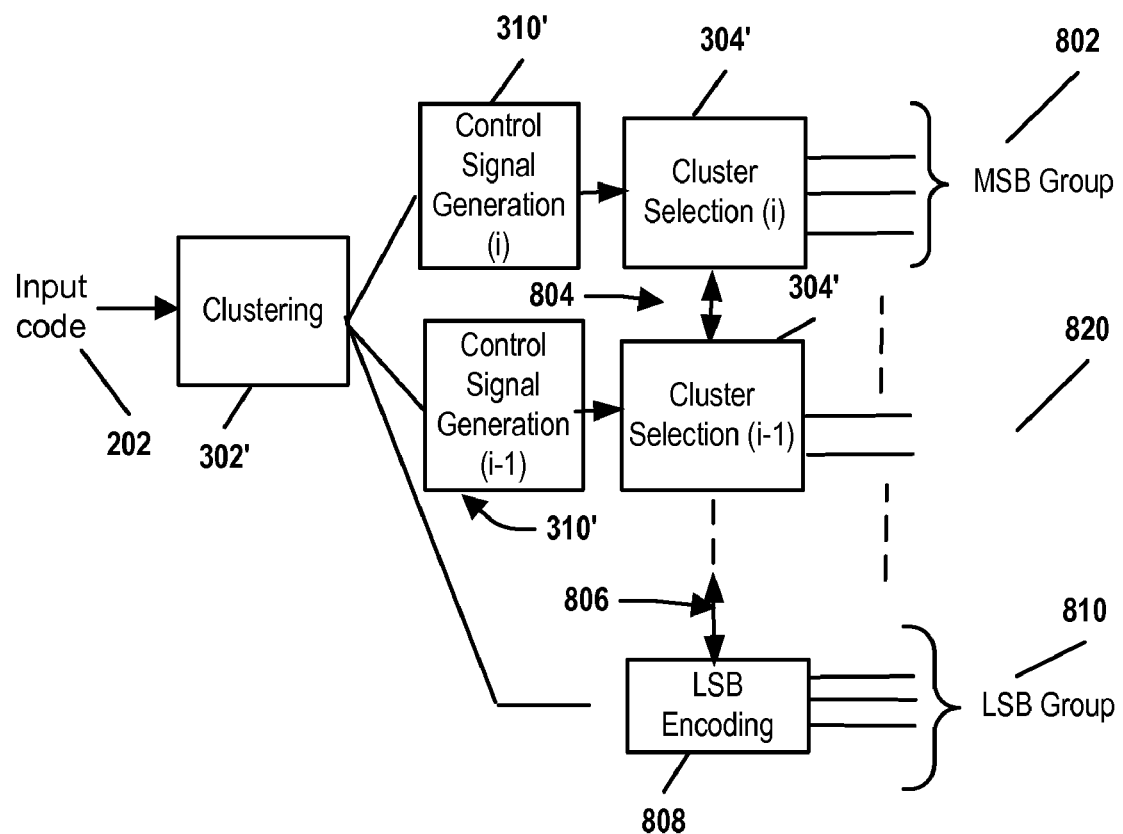
FIG. 8 is a block diagram of an error filtering system with multiple levels of clustering, in accordance with certain configurations of the present disclosure.

FIG. 8 is a block diagram of an error filtering apparatus utilizing multiple levels of clustering, in accordance with certain configurations of the present disclosure. Input thermometer code 202 may be processed by a clustering block 302'. The clustered bits at the output of the clustering block 302' may be processed at various levels of clustering, depicted as control signal generation (i) block 310', control signal generation (i-1) block 310', cluster selection (i) block 304', clustering selection (i-1) block 304', etc. The cluster selection blocks 304' may be configured to communicate carryover signals 804, 806 directly or indirectly with an LSB encoding block 808. The outputs of the cluster selection blocks 304', including the carryover signals 804, 806, may then be used to obtain the output code, depicted as groups, comprising the MSB group 802 and the LSB group 810. The output code may further comprise any additional bit groups 820, corresponding to bit positions between the MSB group 802 and the LSB group 810. The additional bit groups 820 may correspond to intermediate levels of clustering. The carryover signal 806 may also convey identity of the transition cluster to the LSB encoding block 808.

In practice, semiconductor implementation of an output code word generation circuit may require low implementation latency. Broadly speaking, implementation latency may refer to the time delay between the time when a signal is applied to the input and the time when the corresponding output signal is available at the output. Practitioners of the art will appreciate that certain configurations of the present disclosure lend themselves to low latency circuit implementations. For example, with reference to the 6-bit output code example depicted in FIG. 3, in certain configurations, it may be possible to perform bubble error suppression by performing clustering partition (block 302) without any delay, control signal generation (block 310) with one gate delay, and cluster selection (block 304) with one gate delay, while performing LSB encoding (block 306) with two gate delays in parallel, thereby resulting in a two gate delay between the input code and the output code.

The subject technology is illustrated, for example, according to various aspects described below. Numbered clauses are provided below for convenience. These are provided as examples, and do not limit the subject technology.

1. An error suppression circuit apparatus for generating an output signal having an output code from an input signal having a thermometer code representation, the error suppression circuit apparatus comprising:
  a clustering circuit block configured to accept input code bits of the thermometer code representation of the input signal and to partition the input code bits into non-overlapping clusters, wherein each of the clusters comprises a portion of the input code bits;
  a control signal generation circuit block configured to generate a control signal for each of the clusters based on, at least in part, a logical OR operation over all bits in a corresponding one of the clusters;
  a cluster selection circuit block configured to determine a transition cluster for the input code bits based on, at least in part, the control signals, the transition cluster comprising a 1/0 transition in the input code bits, the cluster selection circuit block configured to determine one or more bits of the output code based on, at least in part, an identity of the transition cluster; and
  an encoding circuit block configured to determine the remaining bits of the output code based on, at least in part, an input code bit pattern in the transition cluster, the remaining bits having lower significant bit positions in the output code than the one or more bits,
  wherein the number of bits in the output code is less than the number of bits in the input code bits, and the total number of bits in the clusters is the same as the number of bits in the input code bits.

2. The error suppression circuit apparatus of clause 1, wherein the thermometer code comprises a two's complement representation of the input signal.

3. The error suppression circuit apparatus of clause 1, wherein $K=2^M$, wherein K is the number of bits in the input code bits plus one, and M is the number of bits in the output code.

4. The error suppression circuit apparatus of clause 1, wherein a first one of the clusters is configured to contain N−1 number of bits and is configured to contain lowest significant bits of the input code bits, each of the remaining ones of the clusters is configured to contain N number of bits, and $K=L*N$, and
  wherein K is the number of bits in the input code bits plus one, L is the number of the clusters, and N is a positive integer.

5. The error suppression circuit apparatus of clause 1, wherein a first one of the clusters is configured to contain less number of bits than a second one of the clusters if the first one of the clusters is configured to contain lower significant bits of the input code bits, as compared to the second one of the clusters.

6. The error suppression circuit apparatus of clause 1, wherein the control signal generation circuit block comprises a plurality of bipolar junction transistors (BJTs) in an emitter-coupled configuration.

7. The error suppression circuit apparatus of clause 1, wherein the control signal generation circuit block and the encoding circuit block are configured to operate without performing an XOR operation.

8. A flash analog-to-digital conversion (ADC) circuit comprising the error suppression circuit apparatus of clause 1 and an input signal processing circuit, wherein the input signal processing circuit is configured to receive an analog signal input, wherein the input signal is a thermometer code representation of the analog signal input, wherein the input signal represents the analog signal input with bubble errors.

Figure 9A:
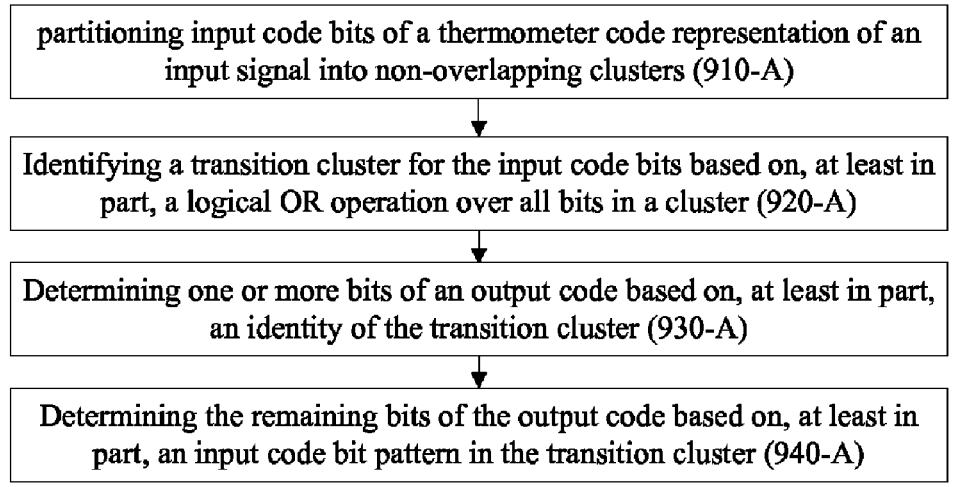
FIG. 9A is a flow chart illustrating an example of a method for generating an output signal from an input signal having a thermometer code representation, in accordance with certain configurations of the present disclosure.

9. An error suppression method for generating an output signal having an output code from an input signal having a thermometer code representation utilizing circuits, the method comprising:
  partitioning, using a circuit, input code bits of the thermometer code representation of the input signal into non-overlapping clusters, wherein each of the clusters comprises a portion of the input code bits (see, e.g., 910-A in FIG. 9A);
  identifying, using a circuit, a transition cluster for the input code bits based on, at least in part, a logical OR operation over all bits in a cluster, the transition cluster comprising a 1/0 transition in the input code bits (see, e.g., 920-A in FIG. 9A);
  determining, using a circuit, one or more bits of the output code based on, at least in part, an identity of the transition cluster (see, e.g., 930-A in FIG. 9A);
  determining, using a circuit, the remaining bits of the output code based on, at least in part, an input code bit pattern in the transition cluster, the remaining bits having lower significant bit positions in the output code than the one or more bits (see, e.g., 940-A in FIG. 9A),
  wherein the number of bits in the output code is less than the number of bits in the input code bits, and the total number of bits in the clusters is the same as the number of bits in the input code bits.

10. The error suppression method of clause 9, wherein the thermometer code comprises a two's complement representation of the input signal.

11. The error suppression method of clause 9, wherein $K=2^M$, wherein K is the number of bits in the input code bits plus one, and M is the number of bits in the output code.

12. The error suppression method of clause 9, wherein a first one of the clusters is configured to contain N−1 number of bits and is configured to contain lowest significant bits of the input code bits, each of the remaining ones of the clusters is configured to contain N number of bits, and $K=L*N$, and
  wherein K is the number of bits in the input code bits plus one, L is the number of the clusters, and N is a positive integer.

13. The error suppression method of clause 9, wherein a first one of the clusters is configured to contain less number of bits than a second one of the clusters if the first one of the clusters is configured to contain lower significant bits of the input code bits, as compared to the second one of the clusters.

14. The error suppression method of clause 9, wherein the identifying operation is performed using, at least in part, a plurality of bipolar junction transistors (BJTs) in an emitter-coupled configuration.

15. The error suppression method of clause 9, wherein the identifying the transition cluster and the determining the remaining bits are performed without an XOR operation.

16. The error suppression method of clause 9, wherein the determining the remaining bits of the output code comprises performing, based on the one or more bits of the output code, a carryover calculation.

Figure 9B:
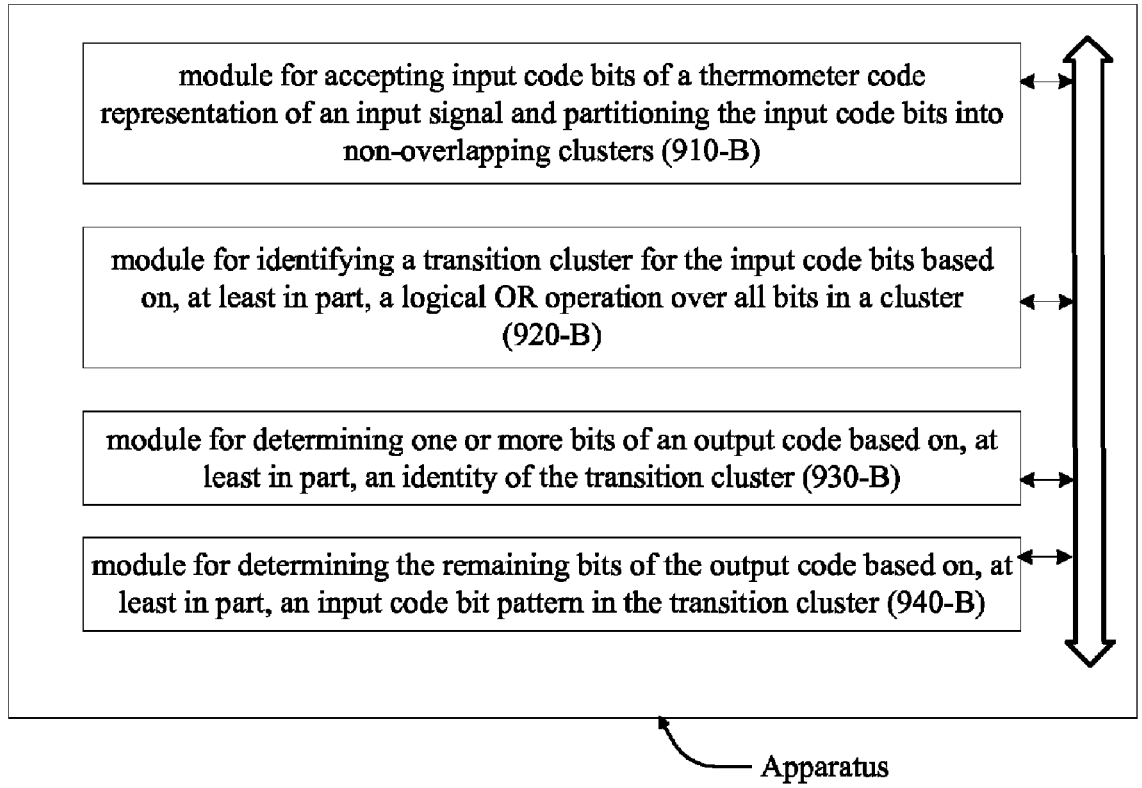
FIG. 9B is a block diagram of an example of an apparatus for generating an output signal from an input signal having a thermometer code representation, in accordance with certain configurations of the present disclosure.

17. An error suppression circuit apparatus for generating an output signal having an output code from an input signal having a thermometer code representation, comprising:
   means for accepting input code bits of the thermometer code representation of the input signal and partitioning the input code bits into non-overlapping clusters, wherein each of the clusters comprises a portion of the input code bits (see, e.g., 910-B in FIG. 9B);
   means for identifying a transition cluster for the input code bits based on, at least in part, a logical OR operation over all bits in a cluster, the transition cluster comprising a 1/0 transition in the input code bits (see, e.g., 920-B in FIG. 9B);
   means for determining one or more bits of the output code based on, at least in part, an identity of the transition cluster (see, e.g., 930-B in FIG. 9B); and
   means for determining the remaining bits of the output code based on, at least in part, an input code bit pattern in the transition cluster, the remaining bits having lower significant bit positions in the output code than the one or more bits (see, e.g., 940-B in FIG. 9B),
   wherein the number of bits in the output code is less than the number of bits in the input code bits, and the total number of bits in the clusters is the same as the number of bits in the input code bits.

18. The error suppression circuit apparatus of clause 17, wherein the thermometer code comprises a two's complement representation of the input signal.

19. The error suppression circuit apparatus of clause 17, wherein $K=2^M$, wherein K is the number of bits in the input code bits plus one, and M is the number of bits in the output code.

20. The error suppression circuit apparatus of clause 17, wherein a first one of the clusters is configured to contain N−1 number of bits and is configured to contain lowest significant bits of the input code bits, each of the remaining ones of the clusters is configured to contain N number of bits, and K=L*N, and
   wherein K is the number of bits in the input code bits plus one, L is the number of the clusters, and N is a positive integer.

21. The error suppression circuit apparatus of clause 17, wherein a first one of the clusters is configured to contain less number of bits than a second one of the clusters if the first one of the clusters is configured to contain lower significant bits of the input code bits, as compared to the second one of the clusters.

The subject technology is illustrated, for example, according to various aspects described below. Numbered clauses are provided below for convenience. These are provided as examples, and do not limit the subject technology.

1. An error suppression circuit apparatus for generating an output signal having an output code from an input signal having a thermometer code representation, the input signal converted from an analog signal, the error suppression circuit apparatus comprising:
   a clustering circuit block configured to accept K−1 input code bits of the thermometer code representation of the input signal and to partition the K−1 input code bits into L non-overlapping clusters, wherein an $i^{th}$ cluster comprises $N_i$ input code bits, K−1 represents the number of input code bits in the thermometer code, L represents the number of non-overlapping clusters, $N_i$ represents the number of input code bits in the $i^{th}$ cluster, and the sum of values of $N_1$ through $N_L$ is K−1;
   a control signal generation circuit block configured to generate a control signal for each of the clusters based on, at least in part, a logical OR operation over all bits in a corresponding one of the clusters;
   a cluster selection circuit block configured to determine a transition cluster for the K−1 input code bits based on, at least in part, the control signals, the transition cluster comprising a 1/0 transition in the K−1 input code bits and configured to determine one or more bits of the output code based on, at least in part, an identity of the transition cluster, wherein the output code is an M-bit output code, M represents the number of bits in the output code, and M is less than K−1; and
   an encoding circuit block configured to determine the remaining bits of the output code based on, at least in part, an input code bit pattern in the transition cluster, the remaining bits having lower significant bit positions in the output code than the one or more bits,
   wherein each of K, L, M, i and $N_i$ is a positive integer, i is less than or equal to L.

2. The error suppression circuit apparatus of clause 1, wherein the thermometer code comprises a two's complement representation of the input signal.

3. The error suppression circuit apparatus of clause 1, wherein $K=2^M$.

4. The error suppression circuit apparatus of clause 1, wherein each of the numbers $N_2$ to $N_L$ is equal to a positive integer N, $N_1$ is equal to N−1, and wherein K=L*N.

5. The error suppression circuit apparatus of clause 1, wherein a $p^{th}$ cluster comprises less number of input code bits than a $q^{th}$ cluster if the $p^{th}$ cluster comprises lower significant bits of the input code bits than the $q^{th}$ cluster, and wherein each of p and q is a positive integer less than or equal to L.

6. The error suppression circuit apparatus of clause 1, wherein the control signal generation circuit block comprises a plurality of bipolar junction transistors (BJTs) in an emitter-coupled configuration.

7. The error suppression circuit apparatus of clause 1, wherein the control signal generation circuit block and the encoding circuit block are configured to operate without performing an XOR operation.

8. A flash analog-to-digital conversion (ADC) circuit comprising the error suppression circuit apparatus of clause 1 and an input signal processing circuit, wherein the input signal processing circuit is configured to receive an analog signal input, wherein the input signal is a thermometer code representation of the analog signal input, wherein the input signal represents the analog signal input with bubble errors, and wherein the output signal represents the analog signal input without bubble errors.

9. An error suppression method for generating an output signal having an output code from an input signal having a thermometer code representation utilizing circuits, the method comprising:
   partitioning, using a circuit, K−1 input code bits of the thermometer code representation of the input signal into L non-overlapping clusters, wherein an $i^{th}$ cluster comprises $N_i$ input code bits, K−1 represents the number of input code bits in the thermometer code, L represents the number of non-overlapping clusters, $N_i$ represents the number of input code bits in the $i^{th}$ cluster, and the sum of numbers $N_1$ to $N_L$ is K−1;

identifying, using a circuit, a transition cluster for the K−1 input code bits based on, at least in part, a logical OR operation over all bits in a cluster, the transition cluster comprising a 1/0 transition in the K−1 input code bits;

determining, using a circuit, one or more bits of the output code based on, at least in part, an identity of the transition cluster, wherein the output code is an M-bit output code, M represents the number of bits in the output code, and M is less than K−1; and determining, using a circuit, the remaining bits of the output code based on, at least in part, an input code bit pattern in the transition cluster, the remaining bits having lower significant bit positions in the output code than the one or more bits, wherein each of K, L, M, i and $N_i$ is a positive integer, i is less than or equal to L.

10. The error suppression method of clause 9, wherein the thermometer code comprises a two's complement representation of the input signal.

11. The error suppression method of clause 9, wherein $K=2^M$.

12. The error suppression method of clause 9, wherein each of the numbers $N_2$ to $N_L$ is equal to a positive integer N, $N_1$ is equal to N−1, and wherein K=L*N.

13. The error suppression method of clause 9, wherein a $p^{th}$ cluster comprises less number of input code bits than a $q^{th}$ cluster if the $p^{th}$ cluster comprises lower significant bits of the input code bits than the $q^{th}$ cluster, and wherein each of p and q is a positive integer less than or equal to L.

14. The error suppression method of clause 9, wherein the identifying operation is performed using, at least in part, a plurality of bipolar junction transistors (BJTs) in an emitter-coupled configuration.

15. The error suppression method of clause 9, wherein the identifying the transition cluster and the determining the remaining bits are performed without an XOR operation.

16. The error suppression method of clause 9, wherein the determining the remaining bits of the output code comprises performing, based on the one or more bits of the output code, a carryover calculation.

17. An error suppression circuit apparatus for generating an output signal having an output code from an input signal having a thermometer code representation, comprising:

means for accepting K−1 input code bits of the thermometer code representation of the input signal and partitioning the K−1 input code bits into L non-overlapping clusters, wherein an $i^{th}$ cluster comprises $N_i$ input code bits, K−1 represents the number of input code bits in the thermometer code, L represents the number of non-overlapping clusters, $N_i$ represents the number of input code bits in the $i^{th}$ cluster, and the sum of numbers $N_1$ to $N_L$ is K−1;

means for identifying a transition cluster for the K−1 input code bits based on, at least in part, a logical OR operation over all bits in a cluster, the transition cluster comprising a 1/0 transition in the K−1 input code bits;

means for determining one or more bits of the output code based on, at least in part, an identity of the transition cluster, wherein the output code is an M-bit output code, M represents the number of bits in the output code, and M is less than K−1; and means for determining the remaining bits of the output code based on, at least in part, an input code bit pattern in the transition cluster, the remaining bits having lower significant bit positions in the output code than the one or more bits, wherein each of K, L, M, i and $N_i$ is a positive integer, i is less than or equal to L.

18. The error suppression circuit apparatus of clause 17, wherein the thermometer code comprises a two's complement representation of the input signal.

19. The error suppression circuit apparatus of clause 17, wherein $K=2^M$.

20. The error suppression circuit apparatus of clause 17, wherein each of the numbers $N_2$ to $N_L$ is equal to a positive integer N, $N_1$ is equal to N−1, and wherein K=L*N.

21. The error suppression circuit apparatus of clause 17, wherein a $p^{th}$ cluster comprises less number of input code bits than a $q^{th}$ cluster if the $p^{th}$ cluster comprises lower significant bits of the input code bits than the $q^{th}$ cluster, and wherein each of p and q is a positive integer less than or equal to L.

The subject technology has been described with particular illustrative configurations. It is to be understood that the subject technology is not limited to the above-described configurations and that various changes and modifications may be made by those of ordinary skill in the art without departing from the scope if the subject technology. For example, various configurations may utilize bipolar complementary metal oxide semiconductor (BiCMOS) implementations using n-p-n bipolar junction transistors (BJT) and metal oxide semiconductor field effect transistors (MOSFETs). Practitioners of the art will recognize that several variations are possible by using different transistor configurations and substrates for implementation.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

In one aspect, the term "coupled" or the like may refer to being directly coupled. In another aspect, the term "coupled" or the like may refer to being indirectly coupled. In one aspect, a transistor may refer to a bipolar junction transistor, a field effect transistor, or the like.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An error suppression circuit apparatus for generating an output signal having an output code from an input signal having a thermometer code representation, the error suppression circuit apparatus comprising:
    a clustering circuit block configured to accept input code bits of the thermometer code representation of the input signal and to partition the input code bits into non-overlapping clusters, wherein each of the clusters comprises a portion of the input code bits;
    a control signal generation circuit block configured to generate a control signal for each of the clusters based on, at least in part, a logical OR operation over all bits in a corresponding one of the clusters;
    a cluster selection circuit block configured to determine a transition cluster for the input code bits based on, at least in part, the control signals, the transition cluster comprising a 1/0 transition in the input code bits, the cluster selection circuit block configured to determine one or more bits of the output code based on, at least in part, an identity of the transition cluster; and
    an encoding circuit block configured to determine the remaining bits of the output code based on, at least in part, an input code bit pattern in the transition cluster, the remaining bits having lower significant bit positions in the output code than the one or more bits,
    wherein the number of bits in the output code is less than the number of bits in the input code bits, and the total number of bits in the clusters is the same as the number of bits in the input code bits,
    wherein the control signal generation circuit block and the encoding circuit block are configured to operate without performing an XOR operation.

2. The error suppression circuit apparatus of claim 1, wherein the thermometer code comprises a sign bit and a plurality of magnitude bits.

3. The error suppression circuit apparatus of claim 1, wherein $K=2^M$, wherein K is the number of bits in the input code bits plus one, and M is the number of bits in the output code.

4. The error suppression circuit apparatus of claim 1, wherein a first one of the clusters is configured to contain N−1 number of bits and is configured to contain lowest significant bits of the input code bits, each of the remaining ones of the clusters is configured to contain N number of bits, and K=L*N, and
    wherein K is the number of bits in the input code bits plus one, L is the number of the clusters, and N is a positive integer.

5. The error suppression circuit apparatus of claim 1, wherein a first one of the clusters is configured to contain less number of bits than a second one of the clusters if the first one of the clusters is configured to contain lower significant bits of the input code bits, as compared to the second one of the clusters.

6. The error suppression circuit apparatus of claim 1, wherein the control signal generation circuit block comprises a plurality of bipolar junction transistors (BJTs) in an emitter-coupled configuration.

7. A flash analog-to-digital conversion (ADC) circuit comprising the error suppression circuit apparatus of claim 1 and an input signal processing circuit, wherein the input signal processing circuit is configured to receive an analog signal input, wherein the input signal is a thermometer code representation of the analog signal input, wherein the input signal represents the analog signal input with bubble errors.

8. An error suppression method for generating an output signal having an output code from an input signal having a thermometer code representation utilizing circuits, the method comprising:
    partitioning, using a circuit, input code bits of the thermometer code representation of the input signal into non-overlapping clusters, wherein each of the clusters comprises a portion of the input code bits;
    identifying, using a circuit, a transition cluster for the input code bits based on, at least in part, a logical OR operation over all bits in a cluster, the transition cluster comprising a 1/0 transition in the input code bits;
    determining, using a circuit, one or more bits of the output code based on, at least in part, an identity of the transition cluster;
    determining, using a circuit, the remaining bits of the output code based on, at least in part, an input code bit pattern in the transition cluster, the remaining bits having lower significant bit positions in the output code than the one or more bits,
    wherein the number of bits in the output code is less than the number of bits in the input code bits, and the total number of bits in the clusters is the same as the number of bits in the input code bits,
    wherein the identifying the transition cluster and the determining the remaining bits are performed without an XOR operation.

9. The error suppression method of claim 8, wherein the thermometer code comprises a sign bit and a plurality of magnitude bits.

10. The error suppression method of claim 8, wherein $K=2^M$, wherein K is the number of bits in the input code bits plus one, and M is the number of bits in the output code.

11. The error suppression method of claim 8, wherein a first one of the clusters is configured to contain N−1 number of bits and is configured to contain lowest significant bits of the input code bits, each of the remaining ones of the clusters is configured to contain N number of bits, and K=L*N, and
    wherein K is the number of bits in the input code bits plus one, L is the number of the clusters, and N is a positive integer.

12. The error suppression method of claim 8, wherein a first one of the clusters is configured to contain less number of bits than a second one of the clusters if the first one of the clusters is configured to contain lower significant bits of the input code bits, as compared to the second one of the clusters.

13. The error suppression method of claim 8, wherein the identifying operation is performed using, at least in part, a plurality of bipolar junction transistors (BJTs) in an emitter-coupled configuration.

14. The error suppression method of claim 8, wherein the determining the remaining bits of the output code comprises performing, based on the one or more bits of the output code, a carryover calculation.

15. An error suppression circuit apparatus for generating an output signal having an output code from an input signal having a thermometer code representation, comprising:
- means for accepting input code bits of the thermometer code representation of the input signal and partitioning the input code bits into non-overlapping clusters, wherein each of the clusters comprises a portion of the input code bits;
- means for identifying a transition cluster for the input code bits based on, at least in part, a logical OR operation over all bits in a cluster, the transition cluster comprising a 1/0 transition in the input code bits;
- means for determining one or more bits of the output code based on, at least in part, an identity of the transition cluster; and
- means for determining the remaining bits of the output code based on, at least in part, an input code bit pattern in the transition cluster, the remaining bits having lower significant bit positions in the output code than the one or more bits,
- wherein the number of bits in the output code is less than the number of bits in the input code bits, and the total number of bits in the clusters is the same as the number of bits in the input code bits,
- wherein the means for identifying the transition cluster and the means for determining the remaining bits are configured to operate without performing an XOR operation.

16. The error suppression circuit apparatus of claim 15, wherein the thermometer code comprises a sign bit and a plurality of magnitude bits.

17. The error suppression circuit apparatus of claim 15, wherein $K=2^M$, wherein K is the number of bits in the input code bits plus one, and M is the number of bits in the output code.

18. The error suppression circuit apparatus of claim 15, wherein a first one of the clusters is configured to contain N−1 number of bits and is configured to contain lowest significant bits of the input code bits, each of the remaining ones of the clusters is configured to contain N number of bits, and K=L*N, and
- wherein K is the number of bits in the input code bits plus one, L is the number of the clusters, and N is a positive integer.

19. The error suppression circuit apparatus of claim 15, wherein a first one of the clusters is configured to contain less number of bits than a second one of the clusters if the first one of the clusters is configured to contain lower significant bits of the input code bits, as compared to the second one of the clusters.

* * * * *

UNITED STATES PATENT AND TRADEMARK OFFICE
CERTIFICATE OF CORRECTION

| | | |
|---|---|---|
| PATENT NO. | : 8,022,854 B2 | Page 1 of 1 |
| APPLICATION NO. | : 12/551452 | |
| DATED | : September 20, 2011 | |
| INVENTOR(S) | : Kevin William Glass et al. | |

It is certified that error appears in the above-identified patent and that said Letters Patent is hereby corrected as shown below:

IN THE SPECIFICATION:

In Column 9, Line 24:  Replace "bit b5", with --bit b56--

In Column 9, Line 27:  Replace "bit b5)" with --bit b56)--

Signed and Sealed this
Twenty-first Day of February, 2012

David J. Kappos
*Director of the United States Patent and Trademark Office*